(12) United States Patent
Matsuoka (10) Patent No.: US 11,506,974 B2
(45) Date of Patent: Nov. 22, 2022

(54) IMPRINT APPARATUS AND ARTICLE MANUFACTURING METHOD

(71) Applicant: CANON KABUSHIKI KAISHA, Tokyo (JP)

(72) Inventor: Yoshihiro Matsuoka, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/130,572

(22) Filed: Dec. 22, 2020

(65) Prior Publication Data
US 2021/0223687 A1  Jul. 22, 2021

(30) Foreign Application Priority Data

Jan. 16, 2020 (JP) .............................. JP2020-005413

(51) Int. Cl.
G03F 7/00 (2006.01)
B29C 33/42 (2006.01)

(52) U.S. Cl.
CPC .......... G03F 7/0002 (2013.01); B29C 33/424 (2013.01); *B29C 2033/426* (2013.01)

(58) Field of Classification Search
CPC ............. B29C 33/424; B29C 2033/426; G03F 7/70483; G03F 7/0002
See application file for complete search history.

(56) References Cited

U.S. PATENT DOCUMENTS

2015/0108674 A1* 4/2015 Murakami ............ G03F 7/0002
264/40.6

FOREIGN PATENT DOCUMENTS

JP 2019012821 A 1/2019

* cited by examiner

*Primary Examiner* — Francisco W Tschen
*Assistant Examiner* — Elisa H Vera
(74) *Attorney, Agent, or Firm* — Rossi, Kimms & McDowell LLP (57) ABSTRACT

The present invention provides an imprint apparatus including a control unit that feedback-controls a mold deformation unit based on difference data indicating a shape difference between a pattern region of a mold and a shot region on a substrate, target data indicating a relative target deformation amount between the pattern region of the mold and the shot region on the substrate, and time series data indicating a relative deformation amount between the pattern region of the mold and the shot region on the substrate which changes at each time while performing shape control on the shot region.

10 Claims, 11 Drawing Sheets

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

An imprint apparatus forms a pattern on a substrate by curing an imprint material on the substrate while a mold on which a pattern is formed is in contact with the imprint material and releasing the mold from the cured imprint material. In general, the imprint apparatus includes a position correcting unit that corrects the positional shift between a mold and a substrate and a shape correcting unit that corrects the shape difference between the mold (its pattern) and the substrate (its shot region). The position correcting unit includes, for example, a moving mechanism that relatively moves (drives) a mold and a substrate. The shape correcting unit includes, for example, a force deformation mechanism that deforms a mold or substrate by pushing and pulling it from its periphery or a thermal deformation mechanism that thermally deforms a mold or substrate by applying heat to it.

Positional shift correction and shape difference correction between a mold and a substrate are performed in the same time zone from the instant the mold is brought into contact with the imprint material on the substrate to the instant the mold is released from the cured imprint material on the substrate in order to improve the productivity of the imprint apparatus. In this case, the shape difference correction between the mold and the substrate sometimes affects the positional shift between the mold and the substrate. Accordingly, Japanese Patent Laid-Open No. 2019-12821 has proposed a technique of correcting a target position set in a moving mechanism that relatively moves a mold and a substrate based on the influence of the shape difference correction between the mold and the substrate on the positional shift between the mold and the substrate as time series data.

However, since the shape difference correction between a mold and a substrate affects not only the positional shift between the mold and the substrate but also a magnification shift, the conventional technique can lead to an increase in the time required for the correction of the magnification shift and a deterioration in overlay accuracy. In addition, in the force deformation mechanism, hysteresis occurs due to pushing and pulling directions, and hence the influence of the thermal deformation mechanism can cause the force deformation mechanism to effect correction on the mold or substrate in an unintentional direction, thus leading to a deterioration in overlay accuracy.

SUMMARY OF THE INVENTION

The present invention provides an imprint apparatus advantageous in implementing accurate overlay between a mold and a substrate in a short period of time.

According to one aspect of the present invention, there is provided an imprint apparatus that forms a pattern of an imprint material on a substrate by using a mold, the apparatus including an obtaining unit configured to obtain difference data indicating a shape difference between a pattern region of the mold and a shot region on the substrate, a mold deformation unit configured to deform the pattern region of the mold by applying a force to the mold, a substrate deformation unit configured to deform the shot region on the substrate by applying heat to the substrate, and a control unit configured to control the mold deformation unit and the substrate deformation unit by making the mold deformation unit perform shape control on the pattern region and making the substrate deformation unit perform shape control on the shot region so as to make the shape difference fall within an allowable range, wherein the control unit feedback-controls the mold deformation unit based on difference data obtained by the obtaining unit, target data indicating a relative target deformation amount between the pattern region of the mold and the shot region on the substrate, and time series data indicating a relative deformation amount between the pattern region of the mold and the shot region on the substrate which changes at each time while the substrate deformation unit performs shape control on the shot region.

Further aspects of the present invention will become apparent from the following description of exemplary embodiments with reference to the attached drawings.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

Figure 1:
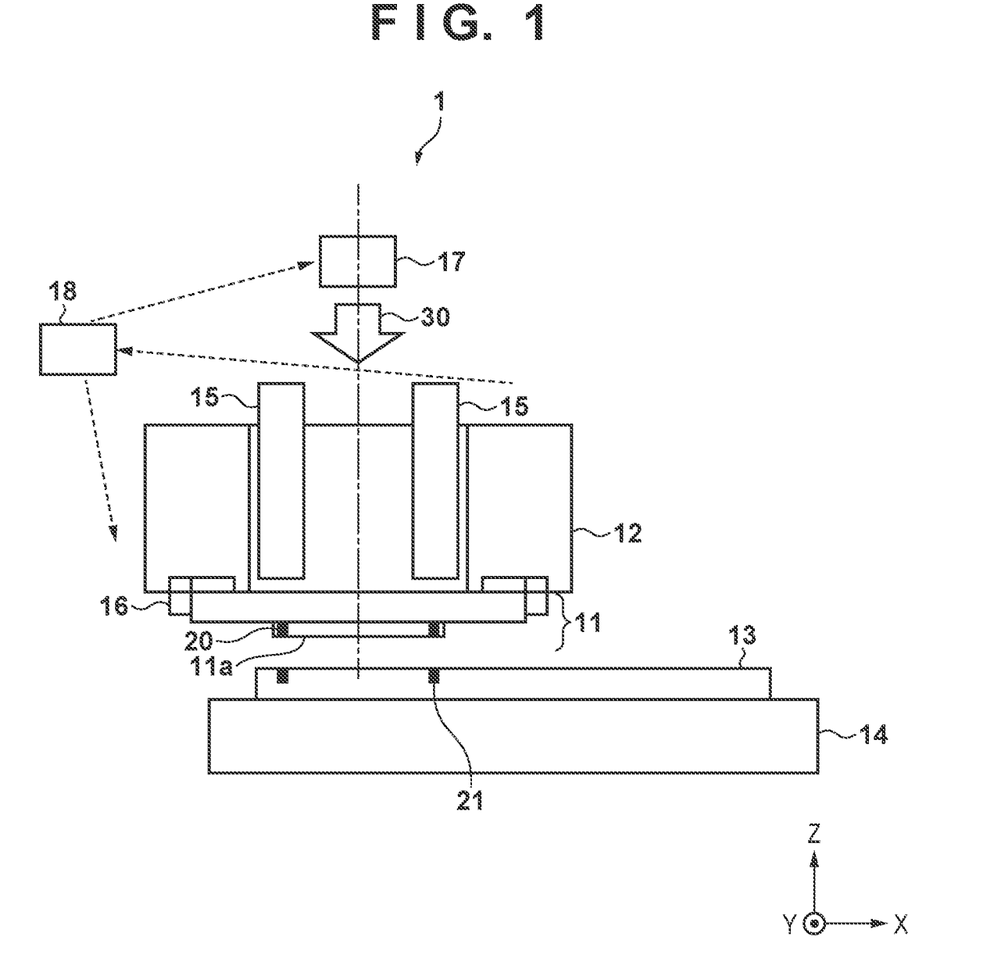
FIG. 1 is a schematic view illustrating configurations of an imprint apparatus as one aspect of the present invention.

FIG. 1 is a schematic view illustrating the configuration of an imprint apparatus 1 according to one aspect of the present invention. The imprint apparatus 1 is used for a lithography process as a manufacturing process for devices such as semiconductor devices, liquid crystal display devices, and magnetic storage media as articles. The imprint apparatus 1 is a lithography apparatus that forms a pattern on a substrate, or more specifically, forms a pattern of an imprint material on a substrate by using a mold. The imprint apparatus 1 brings an uncured imprint material supplied onto a substrate into contact with a mold and applies curing energy to the imprint material to form a pattern of the cured material onto which the pattern of the mold is transferred.

As the imprint material, a curable composition (to be also referred to as a resin in an uncured state) to be cured by receiving curing energy is used. An example of the curing energy that is used is electromagnetic waves and the like. As the electromagnetic waves, for example, infrared light, visible light, ultraviolet light, and the like selected from the wavelength range of 10 nm (inclusive) to 1 mm (inclusive) is used.

The curable composition is a composition cured by light irradiation. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

The imprint material may be applied in a film shape onto the substrate by a spin coater (spin coating method) or a slit coater (slit coating method). The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semiconductor compound wafer, silica glass, and the like.

The imprint apparatus 1 includes a mold holding unit 12 that holds and moves a mold 11, a substrate holding unit 14 that holds and moves a substrate 13, a measurement unit 15, a mold deformation unit 16, a substrate deformation unit 17, and a control unit 18. The imprint apparatus 1 uses, as an imprint material, for example, an ultraviolet curable imprint material that is cured upon irradiation with ultraviolet light (that is, uses a photo-curing method as a curing method for an imprint material).

In the specification and the accompanying drawings, directions will be indicated by an XYZ coordinate system in which directions parallel to the surface of a substrate 13 are set as the X-Y plane. Directions parallel to the X-axis, the Y-axis, and the Z-axis of the XYZ coordinate system are the X direction, the Y direction, and the Z direction, respectively, and a rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θ X-axis, the θ Y-axis, and the θ Z-axis means control or driving concerning a rotation about an axis parallel to the X-axis, a rotation about an axis parallel to the Y-axis, and a rotation about an axis parallel to the Z-axis, respectively.

The mold 11 has a rectangular outer shape and a pattern surface 11a on which a pattern to be transferred onto the substrate 13 is formed. As shown in FIG. 1, the pattern surface 11a (pattern region) of the mold 11 used in the imprint apparatus sometimes has a convex shape (to be sometimes referred to as a mesa portion or mesa region) relative to the substrate 13. In addition, a mold-side mark 20 (alignment mark) is formed on the pattern surface 11a of the mold 11. The substrate 13 is a substrate onto which the pattern of the mold 11 is transferred. A substrate-side mark 21 (alignment mark) is formed on each of a plurality of shot regions on the substrate 13.

The mold holding unit 12 is a holding mechanism that holds the mold 11. The mold holding unit 12 includes, for example, a mold chuck that vacuum-chucks or electrostatically chucks the mold 11, a head that supports the mold chuck, and a mold moving system that moves the head. The mold moving system moves the head (the mold 11) in at least the Z direction. The mold moving system may have a function of moving the head in the X direction, the Y direction, and the θZ direction as well as the Z direction.

The substrate holding unit 14 is a holding mechanism that holds the substrate 13. The substrate holding unit 14 includes, for example, a substrate chuck that vacuum-chucks or electrostatically chucks the substrate 13, a substrate stage that holds the substrate chuck, and a substrate moving system that moves the substrate stage. The substrate moving system moves the substrate stage (the substrate 13) in at least the X direction and the Y direction. The substrate moving system may have a function of moving the substrate stage in the Z direction and the θZ direction as well as the X direction and the Y direction.

The measurement unit 15 includes a scope that optically detects the mold-side mark 20 provided on the mold 11 and the substrate-side mark 21 provided on each of the plurality of shot regions on the substrate 13. The measurement unit 15 obtains position data by measuring the relative position (positional shift) between the mold 11 and the substrate 13 based on the detection result obtained by the scope. The measurement unit 15 also functions as an obtaining unit that obtains difference data indicating the shape difference between the pattern of the mold 11 and each shot region on the substrate from a plurality of position data obtained by detecting the plurality of mold-side marks 20 and the plurality of substrate-side marks 21. Note that the shape difference between the pattern of the mold 11 and each shot region on the substrate includes a deformation shift such as the magnification shift, trapezoidal shift, or distortion between the mold 11 and each shot region on the substrate.

The mold deformation unit 16 has a function of deforming the mold 11 by applying a force to the mold 11. According to this embodiment, the mold deformation unit 16 corrects the shape of the pattern of the mold 11 for each shot region on the substrate 13 in order to reduce the shape difference between the pattern of the mold 11 and each shot region on the substrate 13. The mold deformation unit 16 corrects the shape of the pattern of the mold 11 by deforming the mold 11 (the pattern surface 11a) by applying a force to the mold 11 in a direction parallel to the pattern surface 11a.

The substrate deformation unit 17 has a function of deforming the substrate 13 by applying heat to the substrate 13. According to this embodiment, the substrate deformation unit 17 corrects the shape of each shot region on the substrate 13 by irradiating the substrate 13 at a predetermined position on the substrate with light 30 with a predetermined intensity so as to locally thermally expand the substrate 13 in order to reduce the shape difference between the pattern of the mold 11 and each shot region on the substrate 13. The substrate deformation unit 17 includes a device that can accurately control the irradiation position of the light 30, for example, a DMD (Digital Micromirror Device). The substrate deformation unit 17 corrects the shape of each shot region on the substrate 13 by generating a heated portion on the substrate.

The control unit 18 is constituted by an information processing apparatus (computer) including a CPU and a memory, and causes the imprint apparatus 1 to operate by comprehensively controlling the respective units of the imprint apparatus 1 in accordance with programs stored in the storage unit. According to this embodiment, the control unit 18 controls imprint processing and associated processing. For example, when performing imprint processing, the control unit 18 controls the amount of deformation of the mold 11 by the mold deformation unit 16 and the amount of deformation of the substrate 13 by the substrate deformation unit 17 based on the measurement results obtained by the measurement unit 15. As described above, the control unit 18 controls the mold deformation unit 16 and the substrate deformation unit 17 to make the shape difference between the pattern of the mold 11 and each shot region on the substrate fall within an allowable range by performing shape control on the mold 11 using the mold deformation unit 16 and shape control on the substrate 13 using the substrate deformation unit 17. In addition, the control unit 18 controls at least one of the mold holding unit 12 and the substrate holding unit 14 based on the measurement result obtained by the measurement unit 15 so as to make the positional shift between the pattern of the mold 11 and each shot region on the substrate fall within an allowable range.

Figure 2:
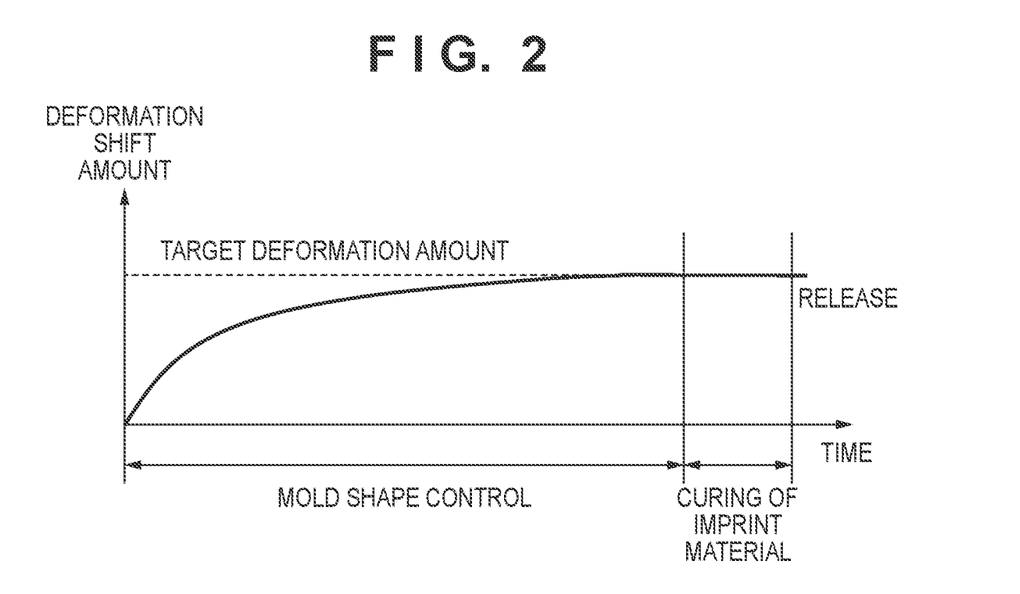
FIG. 2 is a graph for explaining mold shape control by a mold deformation unit.

Shape control on the mold 11 by the mold deformation unit 16 will be described with reference to FIG. 2. Referring to FIG. 2, the ordinate indicates the amount (deformation shift amount) of shape difference (magnification shift, trapezoidal shift, distortion, or the like) between the pattern of the mold 11 and each shot region on the substrate, and the abscissa indicates the time. In shape control on the mold 11 by the mold deformation unit 16, the control unit 18 feedback-controls the mold deformation unit 16 while controlling at least one of the mold holding unit 12 and the substrate holding unit 14 in order to align the mold 11 with the substrate 13. More specifically, the control unit 18 determines the output of the mold deformation unit 16 (the deformation amount of the mold 11) so as to make the deformation shift amount obtained by the measurement unit 15 match a target deformation amount. The control unit 18 narrows down (corrects) the shape of the mold 11 by controlling the mold deformation unit 16 in accordance with the determined output. Since the shot regions on a substrate are regarded to have different shapes respectively, the mold deformation unit 16 needs to perform shape control on the mold 11 for each shot region.

Figure 3:
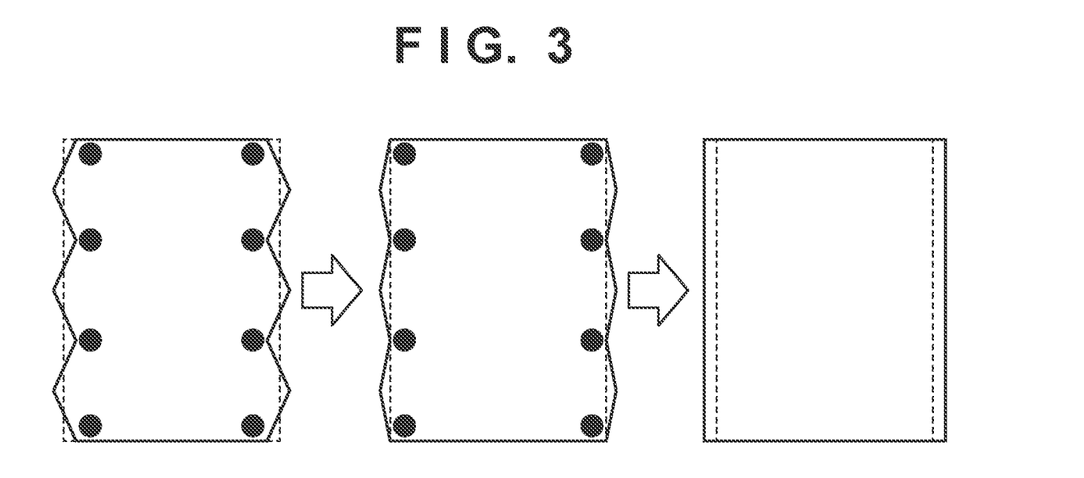
FIG. 3 is a view for explaining substrate shape control by a substrate deformation unit.

Shape control on the substrate 13 by the substrate deformation unit 17 will be described with reference to FIG. 3. As described above, the substrate deformation unit 17 generates a heat distribution on a shot region on the substrate and causes thermal expansion to deform the shot region, thereby correcting a minute shape (high order component) that cannot be corrected by the mold deformation unit 16. Referring to FIG. 3, the dotted lines indicate the shape of the mold 11, and the solid lines indicate the shape of a shot region on the substrate 13. In shape control on the substrate 13 by the substrate deformation unit 17, the complicated shape difference between the mold 11 (the pattern surface 11a) and the substrate 13 can be corrected (eliminated) by heating point portions on the substrate 13. Obviously, however, the pattern of the mold 11 has matched in magnification component the shot region on the substrate before the substrate 13 is heated, whereas the shot region has become larger than the mold 11 after the substrate 13 is heated.

Problems in shape correction based on shape control on the mold 11 by the mold deformation unit 16 and shape control on the substrate 13 by the substrate deformation unit 17 according to the conventional technique will be described with reference to FIGS. 4 and 5.

Figure 4:
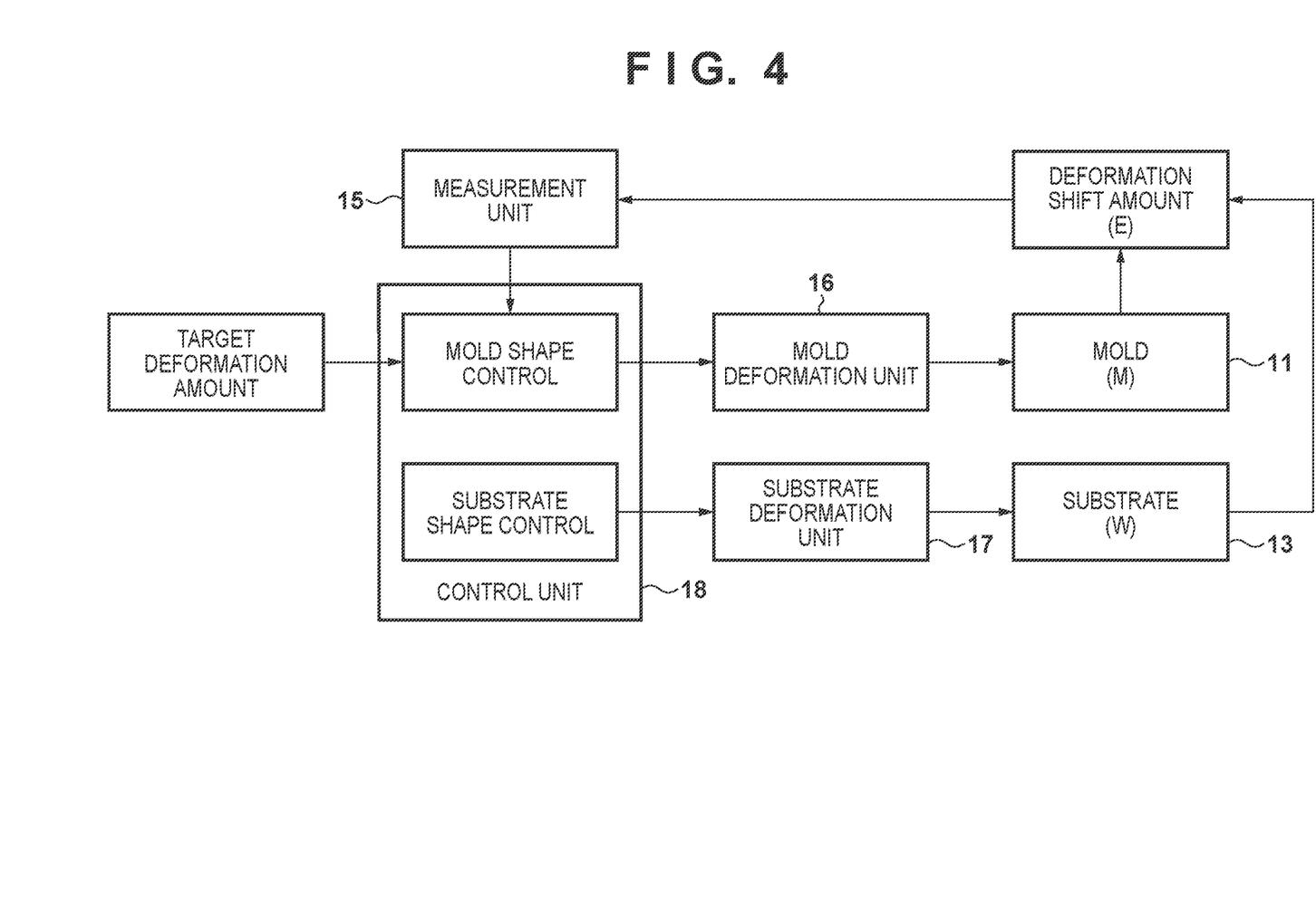
FIG. 4 is a block diagram for explaining problems in shape correction according to the conventional technique.

FIG. 4 is a block diagram schematically illustrating a shape correcting operation according to the conventional technique. Referring to FIG. 4, first of all, the measurement unit 15 obtains, as difference data, a deformation shift amount E corresponding to the amount of shape difference as the difference between a shape M of the pattern of the mold 11 and a shape W of a shot region on the substrate 13. The control unit 18 then controls the mold deformation unit 16 to correct the shape of the pattern of the mold 11 based on the deformation shift amount E obtained by the measurement unit 15 and a target deformation amount (target data) indicating a shift amount corresponding to the relative target shape between the pattern region of the mold 11 and the shot region. The control unit 18 also corrects the shape of the shot region on the substrate 13 by controlling the substrate deformation unit 17.

Figure 5:
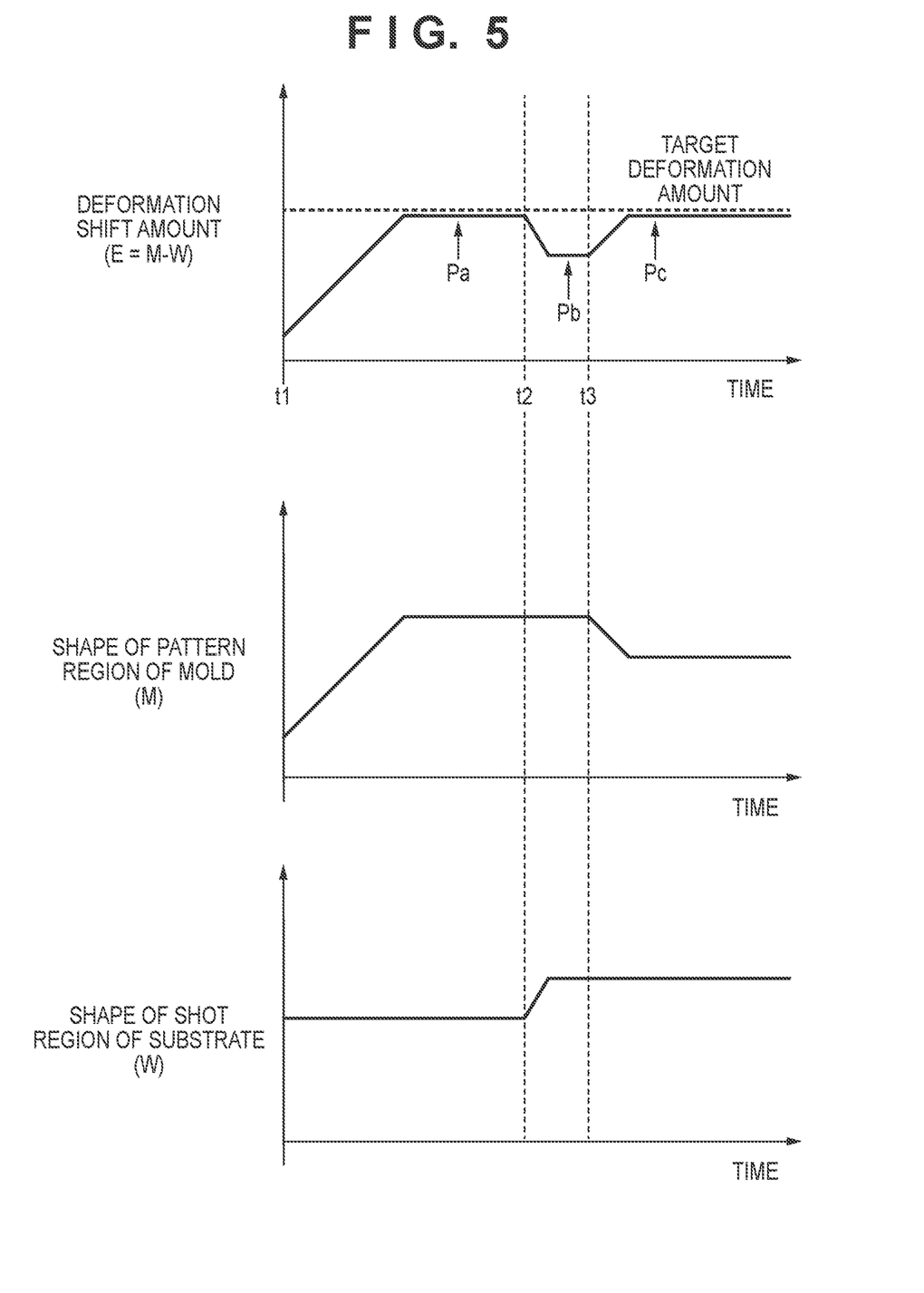
FIG. 5 is a graph for explaining a problem in shape correction according to the conventional technique.

FIG. 5 is a view illustrating an example of temporal changes in the deformation shift amount E, the shape of the pattern of the mold 11, and the shape of a shot region on the substrate 13, based on a shape correcting operation according to the conventional technique. Referring to FIG. 5, in order to match the deformation shift amount E with the target deformation amount, the mold deformation unit 16 starts shape control on the mold 11 from time t1 to deform the shape M of the pattern region of the mold 11. In a period Pa, since the deformation shift amount E matches the target deformation amount, the mold deformation unit 16 maintains the shape of the pattern region of the mold 11 at this time. When the substrate deformation unit 17 starts shape control on the substrate 13 from time t2, the shape W of the shot region on the substrate 13 is deformed. Accordingly, in a period Pb, a shift has occurred between the deformation shift amount E and the target deformation amount. For this reason, the mold deformation unit 16 restarts shape control on the mold 11 from time t3 to finally narrow down the deformation shift amount to the target deformation amount. In a period Pc, the deformation shift amount E matches the target deformation amount. In this manner, according to the conventional technique, shape control on the substrate 13 by the substrate deformation unit 17 affects the deformation shift amount E. This makes it necessary again for the mold deformation unit 16 to perform shape control on the mold 11, resulting in an increase in time taken to complete shape correction.

Accordingly, this embodiment is configured to feedback-control the mold deformation unit 16 based on the deformation shift amount E, the target deformation amount, and the relative deformation amount between the pattern region of the mold 11 and the shot region on the substrate which changes at the respective times while the substrate deformation unit 17 performs shape control on the substrate 13. Shape correction based on shape control on the mold 11 by the mold deformation unit 16 and shape control on the substrate 13 by the substrate deformation unit 17 according to this embodiment will be described below with reference to FIGS. 6 and 7.

Figure 6:
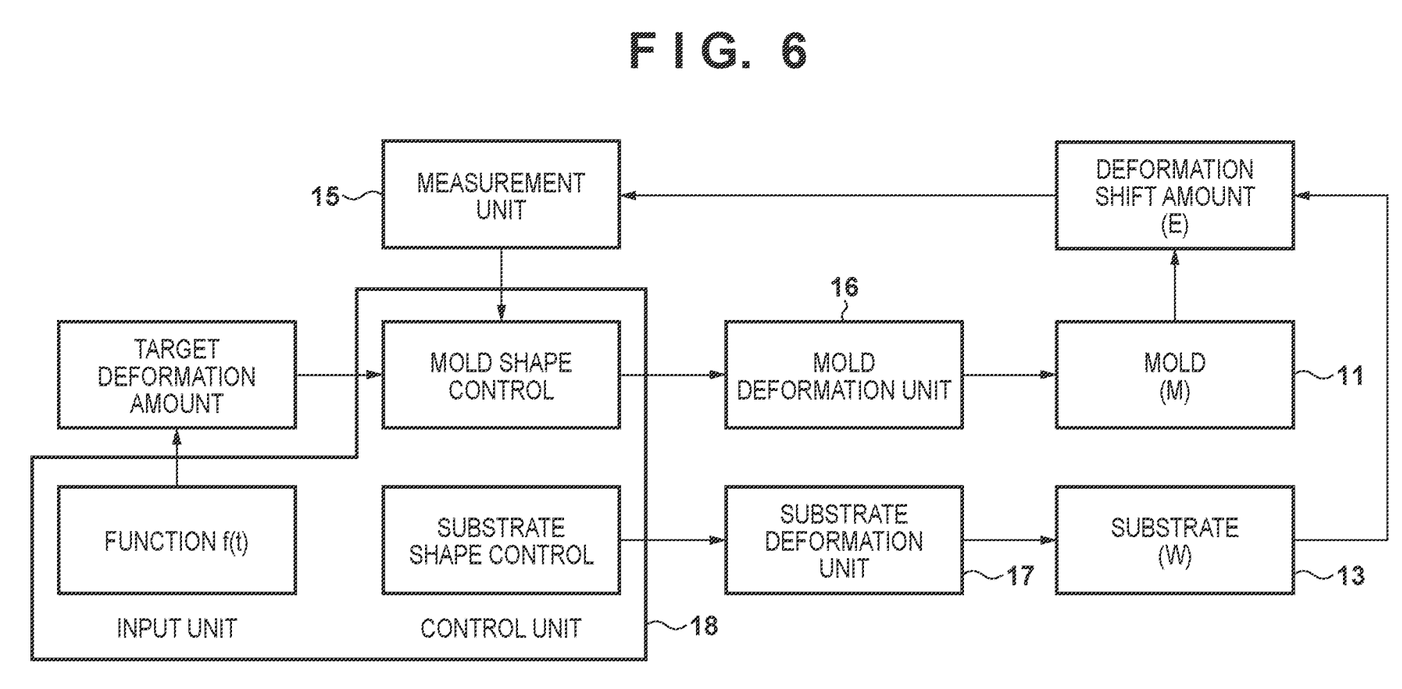
FIG. 6 is a block diagram for explaining shape correction according to the first embodiment.

FIG. 6 is a block diagram schematically illustrating a shape correcting operation according to this embodiment. A function f(t) indicates a deformation shift amount that temporally changes in accordance with shape control on the substrate 13 by the substrate deformation unit 17. In other words, the function f(t) is a function of time and time series data that changes at the respective times while the substrate deformation unit 17 performs shape control on the substrate 13. For example, the function f(t) is time series data indicating the relative deformation amount between the pattern region of the mold 11 and a shot region on the substrate which changes nonlinearly. In the embodiment, the control unit 18 includes an input unit that applies (adds) the function f(t) as the time series data to a target deformation amount as target data. Applying the function f(t) to the target deformation amount in this manner will reduce the shape correction on the mold 11 by the mold deformation unit 16 to a minimum necessary value. Note, however, that the control unit 18 may include an input unit that applies (adds) the function f(t) as the time series data to a deformation shift amount as difference data in place of the input unit that applies the function f(t) to the target deformation amount. In this case as well, similar effects can be obtained.

Figure 7:
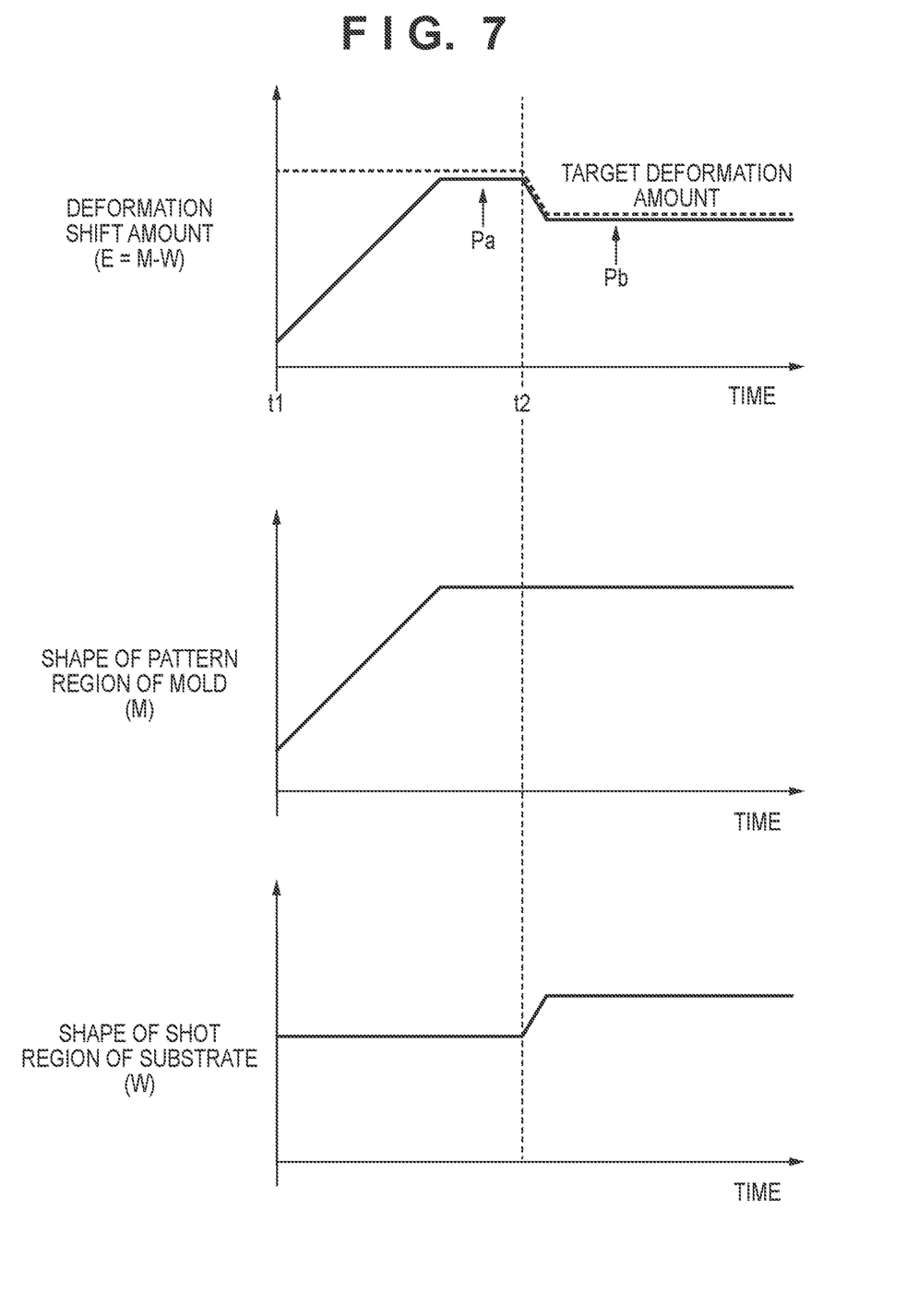
FIG. 7 is a graph for explaining shape correction according to the first embodiment.

FIG. 7 is a view illustrating an example of temporal changes in the deformation shift amount E due to the shape correcting operation according to this embodiment, the shape of the pattern region of the mold 11, and the shape of the shot region on the substrate 13. Referring to FIG. 7, in order to match the deformation shift amount E with the target deformation amount, the mold deformation unit 16 starts shape control on the mold 11 from time t1 to deform the shape M of the pattern region of the mold 11. In the period Pa, since the deformation shift amount E matches the target deformation amount, the mold deformation unit 16 maintains the shape of the pattern region of the mold 11. The substrate deformation unit 17 then starts shape control on the substrate 13 from time t2, and applies the function f(t) to the target deformation amount. With this operation, as shown in FIG. 7, the target deformation amount changes in accordance with the deformation of the substrate 13. This can cancel the influence of shape control on the substrate 13 by the substrate deformation unit 17. Accordingly, as in the conventional technique, the deformation shift amount E can be narrowed down to the target deformation amount in the period Pb without any shift between the deformation shift amount E and the target deformation amount in the period Pb. As described above, this embodiment is advantageous in implementing accurate overlay between the mold 11 and the substrate 13 in a short period of time.

The function f(t) can be obtained by measuring (actually measuring) the deformation shift amount between the pattern region of the mold 11 and a shot region on the substrate 13 using the measurement unit 15 while performing shape control of the substrate 13 by the substrate deformation unit 17 without performing shape control on the mold 11 by the mold deformation unit 16. Alternatively, the function f(t) can be obtained by simulating the influence of shape control on the substrate 13 by the substrate deformation unit 17. The function f(t) may be an approximate curve expressed by a polynomial using time t as a variable or may use the value obtained by actual measurement or simulation. In this case, the deformation shift amount expressed as the function f(t) is expressed as a value that temporally changes. However, since the deformation shift amount is a component that changes in accordance with shape control on the substrate 13 by the substrate deformation unit 17, the amount of light (the amount of heat) with which the substrate 13 is irradiated by the substrate deformation unit 17 or its integrated value may be used as a variable.

Second Embodiment

Figure 8:
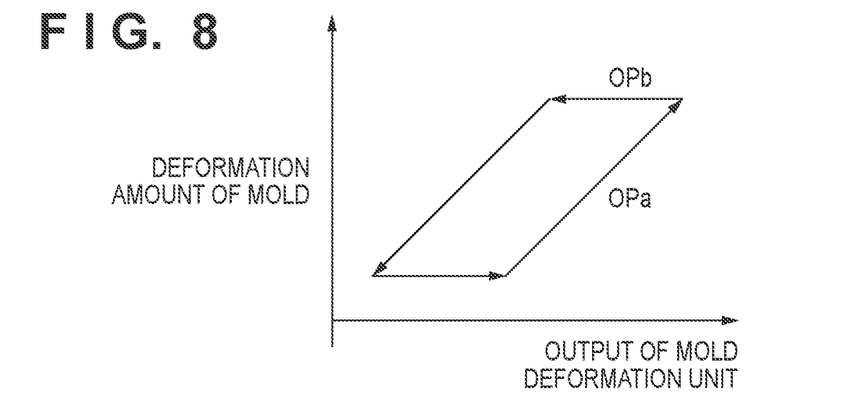
FIG. 8 is a graph for explaining hysteresis.

In shape control on a mold 11 by a mold deformation unit 16, when the direction of the force applied to the mold 11 changes, hysteresis occurs, and the correlation between the output of the mold deformation unit 16 and the deformation amount (the correction amount for the deformation shift amount) of the mold 11 sometimes deteriorates. The hysteresis that occurs in the correlation between the output of the mold deformation unit 16 (the force applied from the mold deformation unit 16 to the mold 11) and the deformation amount of the mold 11 will be described with reference to FIG. 8. Referring to FIG. 8, the ordinate indicates the deformation amount of the mold 11, and the abscissa indicates the output of the mold deformation unit 16. When the shape of the mold 11 is corrected, the output of the mold deformation unit 16 is proportional to the deformation amount of the mold 11 as indicated by OPa in FIG. 8 as long as the direction of the force applied from the mold deformation unit 16 to the mold 11 is one direction (constant). However, when the shape of the mold 11 is excessively corrected to cause necessity to reverse the direction of the force applied from the mold deformation unit 16 to the mold 11, the correlation between the output of the mold deformation unit 16 and the deformation amount of the mold 11 deteriorates as indicated by OPb in FIG. 8.

Figure 9:
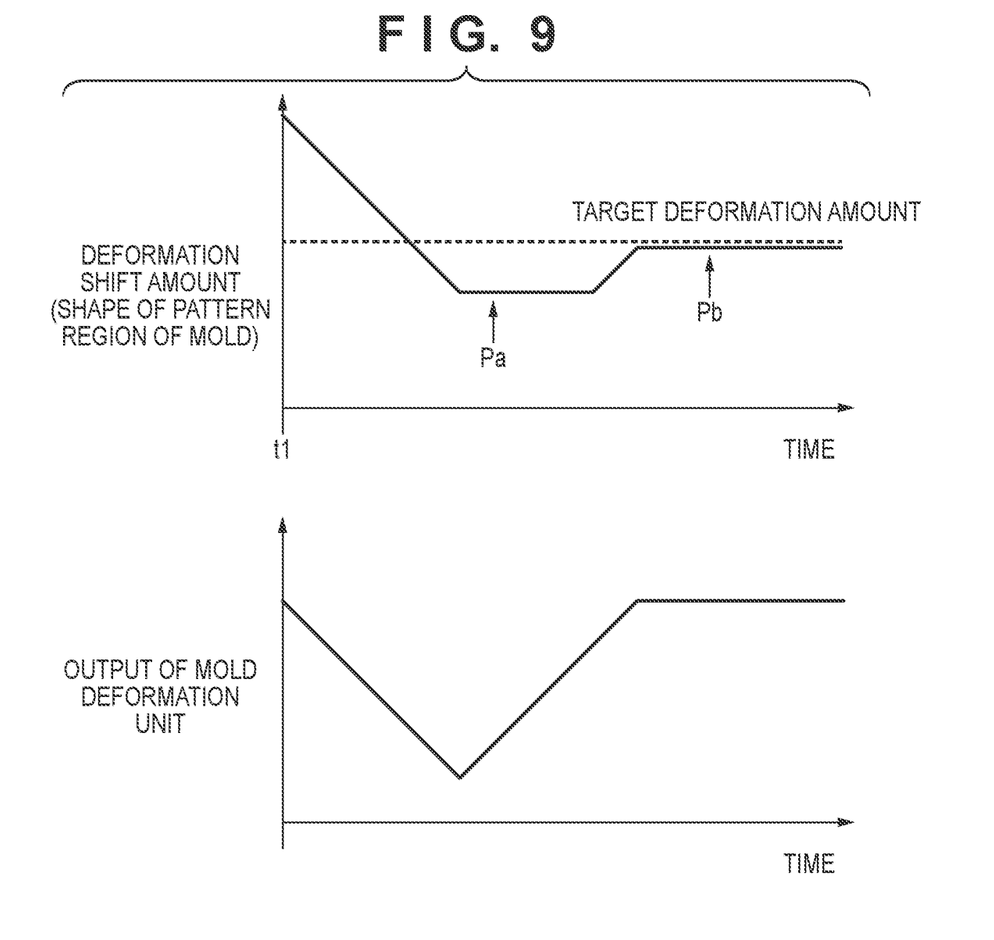
FIG. 9 is a graph for explaining a problem in mold shape control which is caused by hysteresis.

FIG. 9 is a view illustrating an example of temporal changes in deformation shift amount (the shape of the mold 11) and the output of the mold deformation unit 16 when the shape of the mold 11 is excessively corrected in shape control on the mold 11 by the mold deformation unit 16. Referring to FIG. 9, the mold deformation unit 16 starts shape control on the mold 11 from time t1 and gradually deforms the shape of the pattern region of the mold 11. In a period Pa, the shape of the pattern of the mold 11 is excessively corrected (the deformation shift amount exceeds the target deformation amount). Accordingly, it is necessary to reverse the direction of the force applied from the mold deformation unit 16 to the mold 11, and hence hysteresis occurs, resulting in that the output of the mold deformation unit 16 is not reflected in the deformation of the mold 11. Subsequently, the deformation shift amount can be narrowed down to the target deformation amount in a period Pb. However, the hysteresis leads to an increase in the time taken to complete shape control on the mold 11 by the mold deformation unit 16.

Accordingly, in this embodiment, as in the first embodiment, the target deformation amount as a function f(t) is changed in accordance with time to reduce (prevent) a delay in shape control on the mold 11 by the mold deformation unit 16 due to hysteresis.

Figure 10:
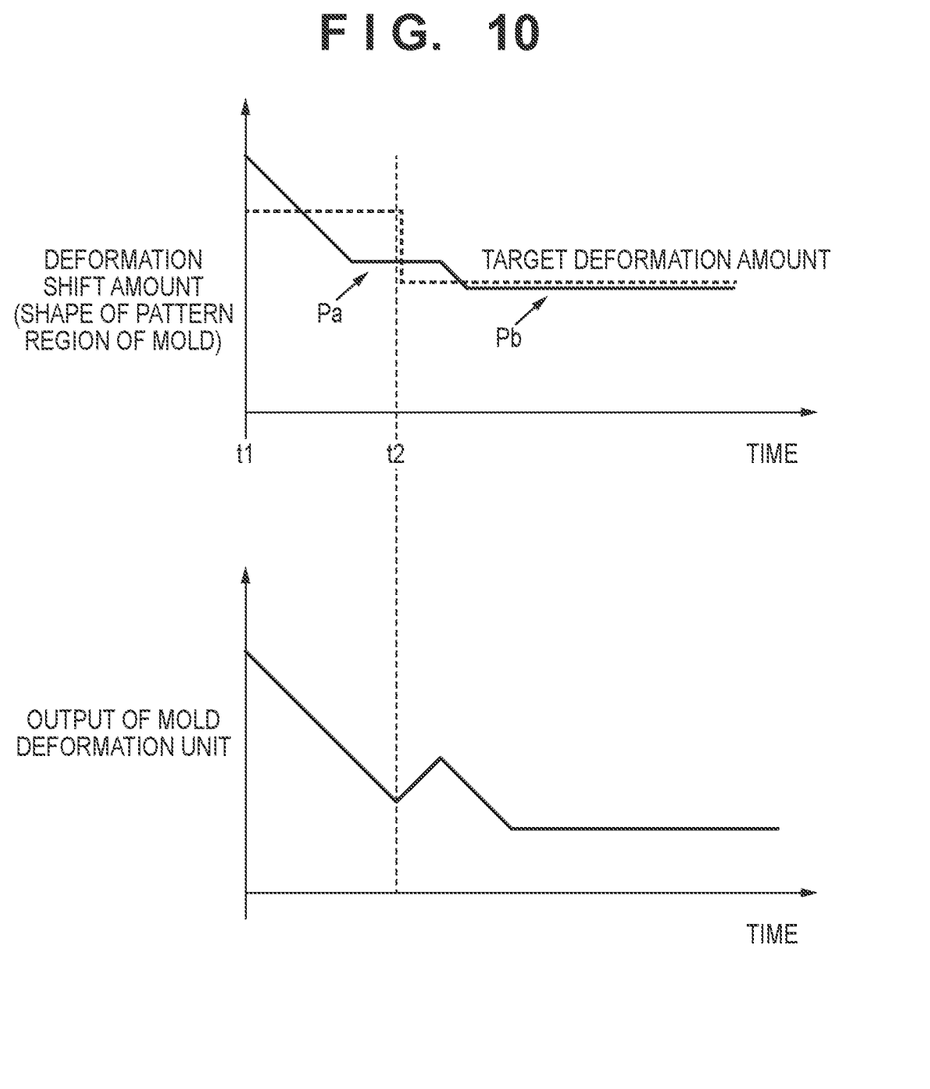
FIG. 10 is a graph for explaining mold shape control according to the second embodiment.

FIG. 10 is a view illustrating an example of temporal changes in deformation shift amount due to an operation of shape control on the mold 11 and the output of the mold deformation unit 16 according to this embodiment. Referring to FIG. 10, the mold deformation unit 16 starts shape control on the mold 11 from time t1 and gradually deforms the shape of the pattern region of the mold 11. In the embodiment, a large target deformation amount is set. For this reason, in the period Pa, although the deformation shift amount exceeds the target deformation amount, the deformation shift amount can be narrowed down to the target deformation amount in a period Pb without causing any hysteresis by applying the function f(t) to the target deformation amount from time t2. As described above, the embodiment is advantageous in implementing accurate overlay between the mold 11 and a substrate 13 in a short period of time.

The function f(t) is obtained from actual measurement or simulation as in the first embodiment. More specifically, the magnitude of difference between a deformation shift amount and a target deformation amount and corresponding timings are obtained, and the function f(t) is obtained, which changes stepwise the set initial value of the target deformation amount so as not to make the deformation shift amount exceed the final target deformation amount even though exceeding the initial target deformation amount, as shown in FIG. 10. In addition, when the time taken for shape control on the mold 11 by the mold deformation unit 16 is set, the function f(t) may be applied to the target deformation amount so as to continuously change the amount from the initial deformation shift amount to the final target deformation amount in proportion to the time.

Third Embodiment

Figure 11:
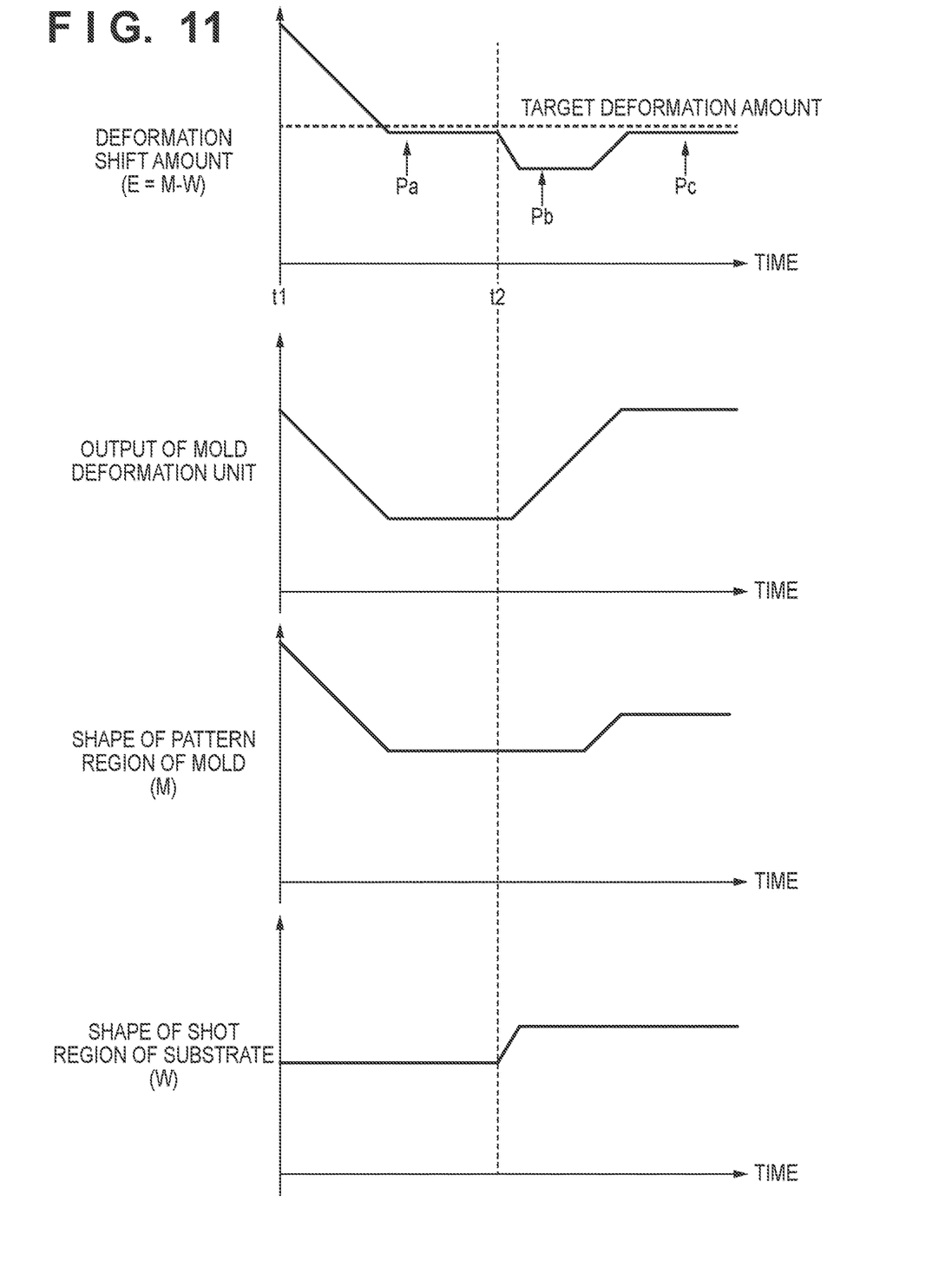
FIG. 11 is a graph for explaining a problem in shape correction according to the conventional technique.

In some cases, shape correction for a substrate 13 by a substrate deformation unit 17 affects a deformation shift amount to cause hysteresis. FIG. 11 is a view illustrating an example of temporal changes in a deformation shift amount E due to a shape correcting operation, the output of a mold deformation unit 16, the shape of the pattern region of a mold 11, and the shape of a shot region on the substrate 13 according to the conventional technique. Referring to FIG. 11, in order to match the deformation shift amount E with the target deformation amount, the mold deformation unit 16 starts shape control on the mold 11 from time t1 and deforms a shape M of the pattern region of the mold 11. In a period Pa, since the deformation shift amount E matches the target deformation amount, the mold deformation unit 16 maintains the shape of the pattern region of the mold 11 at this time. When the substrate deformation unit 17 starts shape control on the substrate 13 from time t2, a shape W of the shot region on the substrate 13 is deformed. Accordingly, in a period Pb, a shift has occurred between the deformation shift amount E and the target deformation amount. Since the direction of the shift is reverse to the first narrowing-down direction, hysteresis occurs when the mold deformation unit 16 restarts shape control on the mold 11. In the period Pb, therefore, the output of the mold deformation unit 16 is not reflected in the deformation of the mold 11. Subsequently, the deformation shift amount can be narrowed down to the target deformation amount in a period Pb. However, the hysteresis leads to an increase in the time taken to complete shape correction.

Accordingly, in this embodiment, as in the first embodiment, a change in deformation shift amount between the mold 11 and the substrate 13 which is predicted from the amount of heat added by light with which the substrate 13 is irradiated by the substrate deformation unit 17 is provided as a function f(t). This prevents the occurrence of deviation between the target deformation amount and the deformation shift amount which is caused by shape control on the substrate 13 by the substrate deformation unit 17 and prevents the occurrence of hysteresis.

Figure 12:
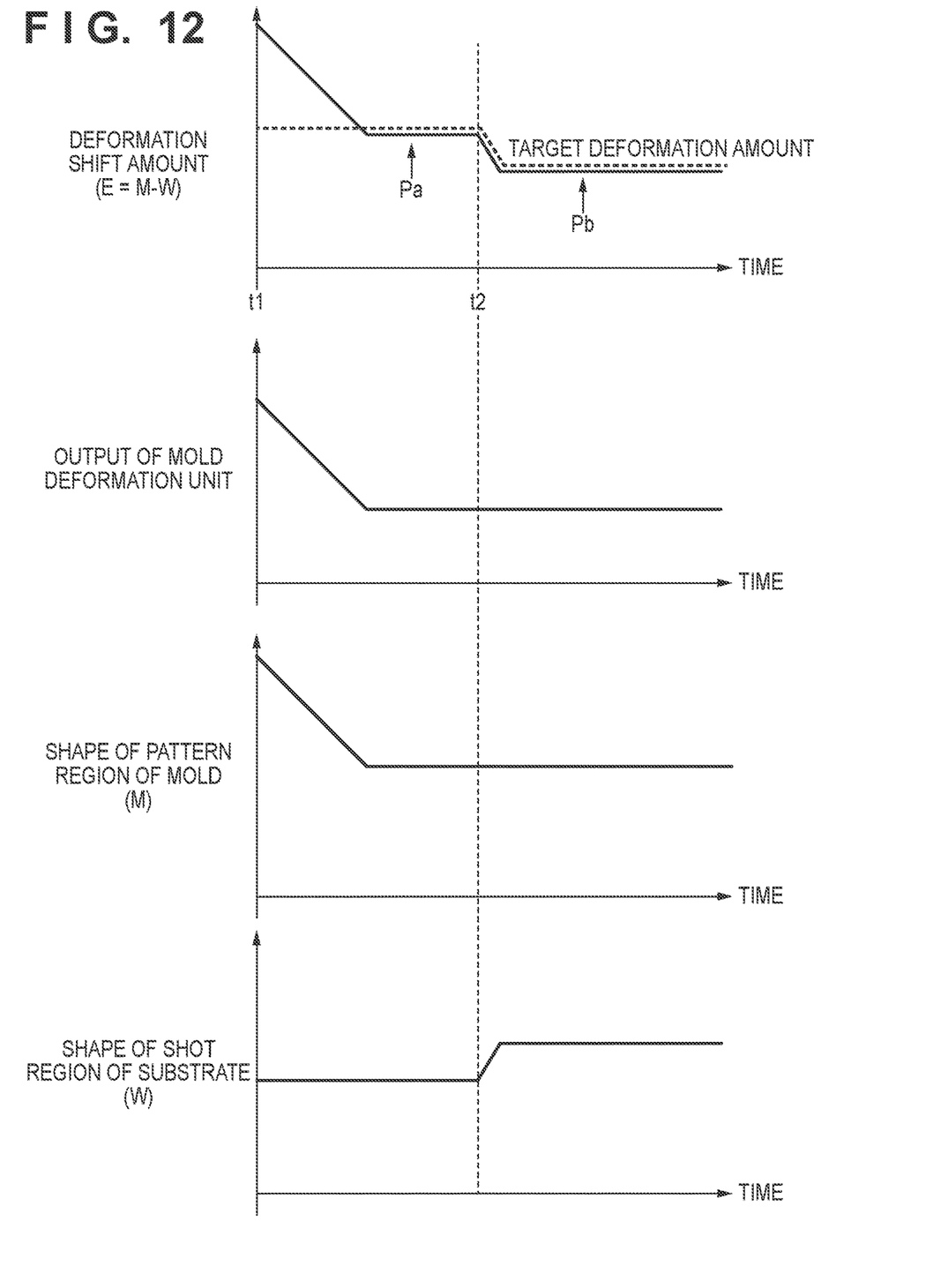
FIG. 12 is a graph for explaining shape correction according to the third embodiment.

FIG. 12 is a view illustrating an example of temporal changes in the deformation shift amount E due to a shape correcting operation, the output of the mold deformation unit 16, the shape of the pattern region of the mold 11, and the shape of a shot region on the substrate 13 according to this embodiment. Referring to FIG. 12, the mold deformation unit 16 starts shape control on the mold 11 from time t1 and deforms the shape M of the pattern region of the mold 11. In the period Pa, since the deformation shift amount E matches the target deformation amount, the mold deformation unit 16 maintains the shape of the pattern region of the mold 11 at this time. The substrate deformation unit 17 then starts shape control on the substrate 13 from time t2 and applies the function f(t) to the target deformation amount. As shown in FIG. 12, this changes the target deformation amount in accordance with the deformation of the substrate 13 to cancel the influence of shape control on the substrate 13 by the substrate deformation unit 17. Accordingly, there is no need to reverse the direction of the force applied from the mold deformation unit 16 to the mold 11, and hence no hysteresis occurs, and the deformation shift amount can be narrowed down to the target deformation amount in the period Pb. As described above, this embodiment is advantageous in implementing accurate overlay between the mold 11 and the substrate 13 in a short period of time.

The function f(t) can be obtained by actually measuring or simulating the influence of shape correction of the substrate 13 by the substrate deformation unit 17 as in the first embodiment. In addition, the amount of light (the amount of heat) with which the substrate 13 is irradiated by the substrate deformation unit 17 or its integrated value may be used as a variable as well as the time t. Furthermore, as in the second embodiment, in order to prevent the occurrence of hysteresis, a component that changes stepwise or continuously from a small amount relative to the final target deformation amount may be applied to the function f(t).

Fourth Embodiment

The pattern of a cured product formed using the imprint apparatus 1 is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 13A:
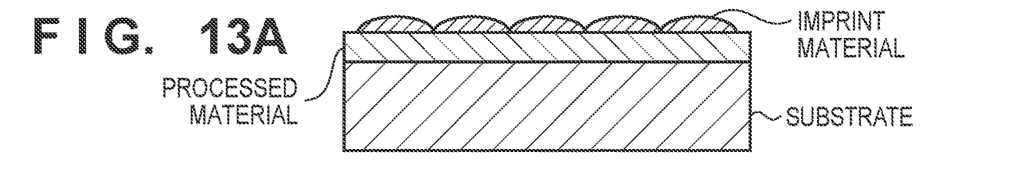
FIG. 13A to FIG. 13F are views for describing an article manufacturing method.

Next, description regarding a detailed method of manufacturing an article is given. As illustrated in FIG. 13A, the substrate such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

Figure 13B:
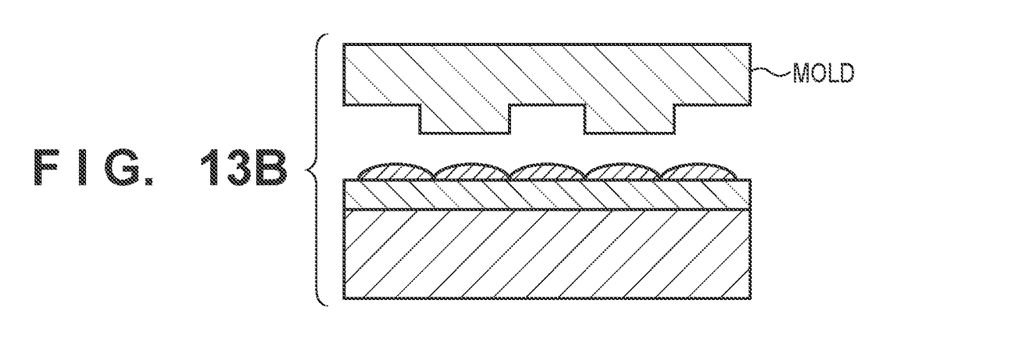
Figure 13C:
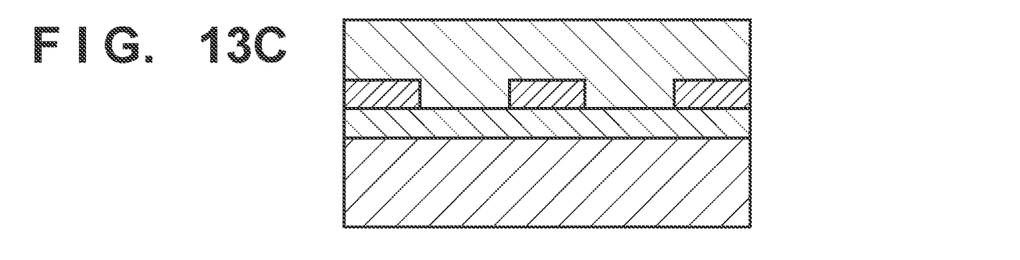

As shown in FIG. 13B, a side of the mold for imprint with a concave-convex pattern is formed on and caused to face the imprint material on the substrate. As illustrated in FIG. 13C, the substrate to which the imprint material is applied is brought into contact with the mold, and a pressure is applied. The gap between the mold and the processed material is filled with the imprint material. In this state, when the imprint material is irradiated with light serving as curing energy through the mold, the imprint material is cured.

Figure 13D:
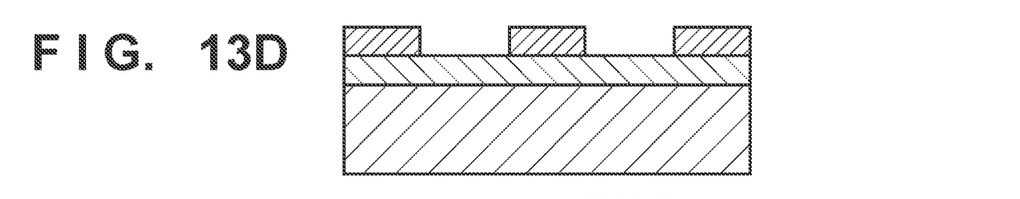

As shown in FIG. 13D, after the imprint material is cured, the mold is released from the substrate. Thus, the pattern of the cured product of the imprint material is formed on the substrate. In the pattern of the cured product, the concave portion of the mold corresponds to the convex portion of the cured product, and the convex portion of the mold corresponds to the concave portion of the cured product. That is, the concave-convex pattern of the mold is transferred to the imprint material.

Figure 13E:
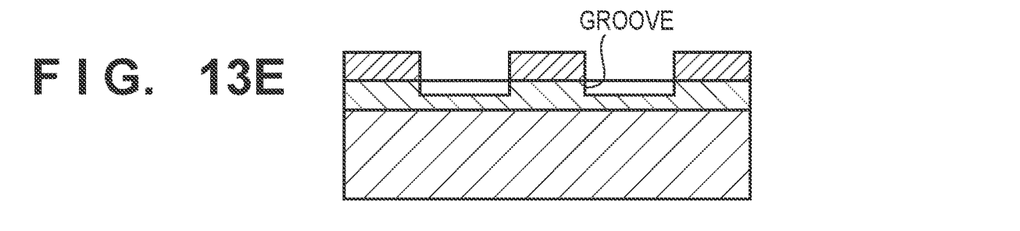
Figure 13F:
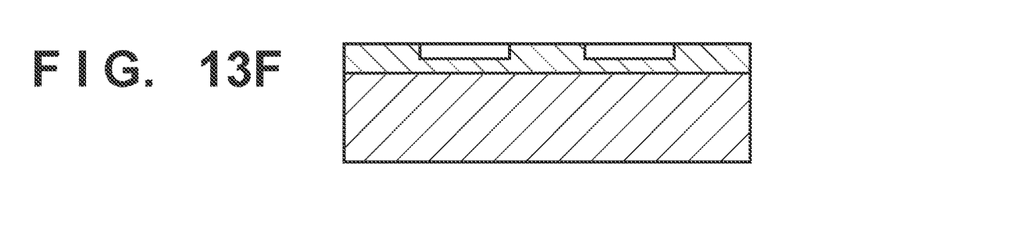

As shown in FIG. 13E, when etching is performed using the pattern of the cured product as an etching resistant mask, a portion of the surface of the processed material where the cured product does not exist or remains thin is removed to form a groove. As shown in FIG. 13F, when the pattern of the cured product is removed, an article with the grooves formed in the surface of the processed material can be obtained. The pattern of the cured material is removed here, but, for example, the pattern may be used as a film for insulation between layers included in a semiconductor element or the like without being removed after processing, in other words as a constituent member of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2020-005413 filed on Jan. 16, 2020, which is hereby incorporated by reference herein in its entirety.

What is claimed is:

1. An imprint apparatus that forms a pattern of an imprint material on a substrate by using a mold, the apparatus comprising:
    a scope that optically detects difference data indicating a shape difference between a pattern region of the mold and a shot region on the substrate;
    a force deformation mechanism that deforms the pattern region of the mold by applying a force to the mold;
    an optical system including a device that controls the irradiation position of the light, wherein the optical system deforms the shot region on the substrate by applying heat to the substrate; and
    a control unit that controls the force deformation mechanism and the optical system by making the force deformation mechanism perform shape control on the pattern region and making the optical system perform shape control on the shot region so as to make the shape difference fall within an allowable range,
    wherein the control unit:
        receives time series data including a plurality of measurements indicating relative deformation amounts between the pattern region of the mold and the shot region on the substrate, which changes a plurality of times during a time period corresponding to when the optical system performs shape control on the shot region; and
        feedback-controls the force deformation mechanism to deform the pattern region of the mold a plurality of times based on the difference data obtained by the scope, target data indicating a relative target deformation amount between the pattern region of the mold and the shot region on the substrate, and the time series data.

2. The apparatus according to claim 1, wherein the time series data changes nonlinearly at each time of the plurality of times during the time period corresponding to when optical system performs shape control on the shot region.

3. The apparatus according to claim 1, wherein the relative deformation amount indicated by the time series data includes a deformation amount that sets a direction of a force applied from the force deformation mechanism to the mold to one direction while the force deformation mechanism performs shape control on the pattern region.

4. The apparatus according to claim 1, wherein the control unit applies the time series data to the target data.

5. The apparatus according to claim 1, wherein the control unit applies the time series data to the difference data.

6. The apparatus according to claim 1, wherein the scope obtains position data by measuring a relative position between the mold and the substrate, and obtains the difference data from a plurality of position data.

7. The apparatus according to claim 6, further comprising:
    a mold holder configured to hold and move the mold; and
    a substrate holder configured to hold and move the substrate, wherein the control unit controls at least one of the mold holder and the substrate holder based on position data obtained by the scope so as to make a position shift between the pattern region of the mold and the shot region on the substrate fall within the allowable range.

8. The apparatus according to claim 7, wherein the control unit feedback-controls the force deformation mechanism while controlling at least one of the mold holder and the substrate holder.

9. The apparatus according to claim 1, wherein the control unit feedback-controls the force deformation mechanism to deform the pattern region of the mold during the time period corresponding to when the optical system performs shape control on the shot region.

10. An imprint apparatus that forms a pattern of an imprint material on a substrate by using a mold, the apparatus comprising:
    a scope that optically detects difference data indicating a shape difference between a pattern region of the mold and a shot region on the substrate;
    a force deformation mechanism that deforms the pattern region of the mold by applying a force to the mold;
    an optical system including a device that controls the irradiation position of the light, wherein the optical system deforms the shot region on the substrate by applying heat to the substrate; and
    a control unit that controls the force deformation mechanism and the optical system by making the force deformation mechanism perform shape control on the pattern region and making the optical system perform shape control on the shot region so as to make the shape difference fall within an allowable range,
    wherein the control unit:
        receives time series data indicating relative deformation amounts between the pattern region of the mold and the shot region on the substrate, which changes a plurality of times during a time period corresponding to when the optical system performs shape control on the shot region; and
        feedback-controls the force deformation mechanism to deform the pattern region of the mold a plurality of times based on the difference data obtained by the scope, target data indicating a relative target deformation amount between the pattern region of the mold and the shot region on the substrate, and the time series data.

\* \* \* \* \*